US008534574B2

(12) United States Patent
Simion et al.

(10) Patent No.: US 8,534,574 B2
(45) Date of Patent: Sep. 17, 2013

(54) UNDERFILL MATERIAL DISPENSER (75) Inventors: Bogdan M Simion, Chandler, AZ (US);
Curtis S. White, Phoenix, AZ (US);
Sung-Won Moon, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 569 days.

(21) Appl. No.: 12/756,726

(22) Filed: Apr. 8, 2010

(65) Prior Publication Data
US 2011/0248046 A1 Oct. 13, 2011

(51) Int. Cl.
*B05B 1/28* (2006.01)
*B05B 1/24* (2006.01)

(52) U.S. Cl.
USPC ......... 239/290; 239/139; 222/509; 222/146.2

(58) Field of Classification Search
USPC ............... 222/146.2, 146.4, 135, 504, 559, 222/309; 239/290, 7, 120, 121, 122; 141/121, 141/122
See application file for complete search history.

(56) References Cited

U.S. PATENT DOCUMENTS

| 4,179,068 | A | * | 12/1979 | Dombrowski | 239/13 |
|---|---|---|---|---|---|
| 5,022,556 | A | * | 6/1991 | Dency et al. | 222/1 |
| 5,071,074 | A | * | 12/1991 | Lind | 239/707 |
| 5,275,336 | A | * | 1/1994 | Stasi et al. | 239/84 |
| 5,747,102 | A | * | 5/1998 | Smith et al. | 427/98.4 |
| 6,126,039 | A | * | 10/2000 | Cline et al. | 222/63 |
| 6,253,957 | B1 | * | 7/2001 | Messerly et al. | 222/1 |
| 6,270,019 | B1 | * | 8/2001 | Reighard | 239/1 |
| 6,691,895 | B2 | * | 2/2004 | Strecker | 222/145.1 |
| 7,083,115 | B2 | * | 8/2006 | Huffman | 239/135 |
| 7,296,714 | B2 | * | 11/2007 | Byerly | 222/504 |
| 7,900,800 | B2 | * | 3/2011 | Hassler et al. | 222/146.5 |
| 2005/0161477 | A1 | * | 7/2005 | Strecker et al. | 222/504 |
| 2009/0101669 | A1 | * | 4/2009 | Hassler et al. | 222/1 |

* cited by examiner

*Primary Examiner* — Paul R Durand
*Assistant Examiner* — Charles P Cheyney
(74) *Attorney, Agent, or Firm* — Winkle, PLLC (57) ABSTRACT The present disclosure relate to the field of depositing an underfill material between a microelectronic die and a substrate for flip-chip packages with an underfill material dispenser. In at least one embodiment, an underfill material dispenser may include a heater having a plurality of conduits. Other embodiments of the present disclosure may further include multiple dispense needle configurations, angled dispense nozzle exit conduits, conical nozzle exit conduits, and satellite traps.

12 Claims, 8 Drawing Sheets

UNDERFILL MATERIAL DISPENSER

BACKGROUND

A typical microelectronic package includes at least one microelectronic die that is mounted on a substrate such that bond pads on the microelectronic die are attached directly to corresponding bond lands on the substrate using reflowable solder balls. To enhance the reliability of the solder bumps connecting the microelectronic die pads and the substrate lands, an underfill material may be used to mechanically reinforce them.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of depositing an underfill material between a microelectronic die and a substrate for flip-chip packages with an underfill material dispenser. In at least one embodiment, the underfill material dispenser may include a heater having a plurality of conduits. Other embodiments of the present disclosure may further include multiple dispense needle configurations, angled dispense nozzle exit conduits, conical nozzle exit conduits, and satellite traps.

Figure 1:
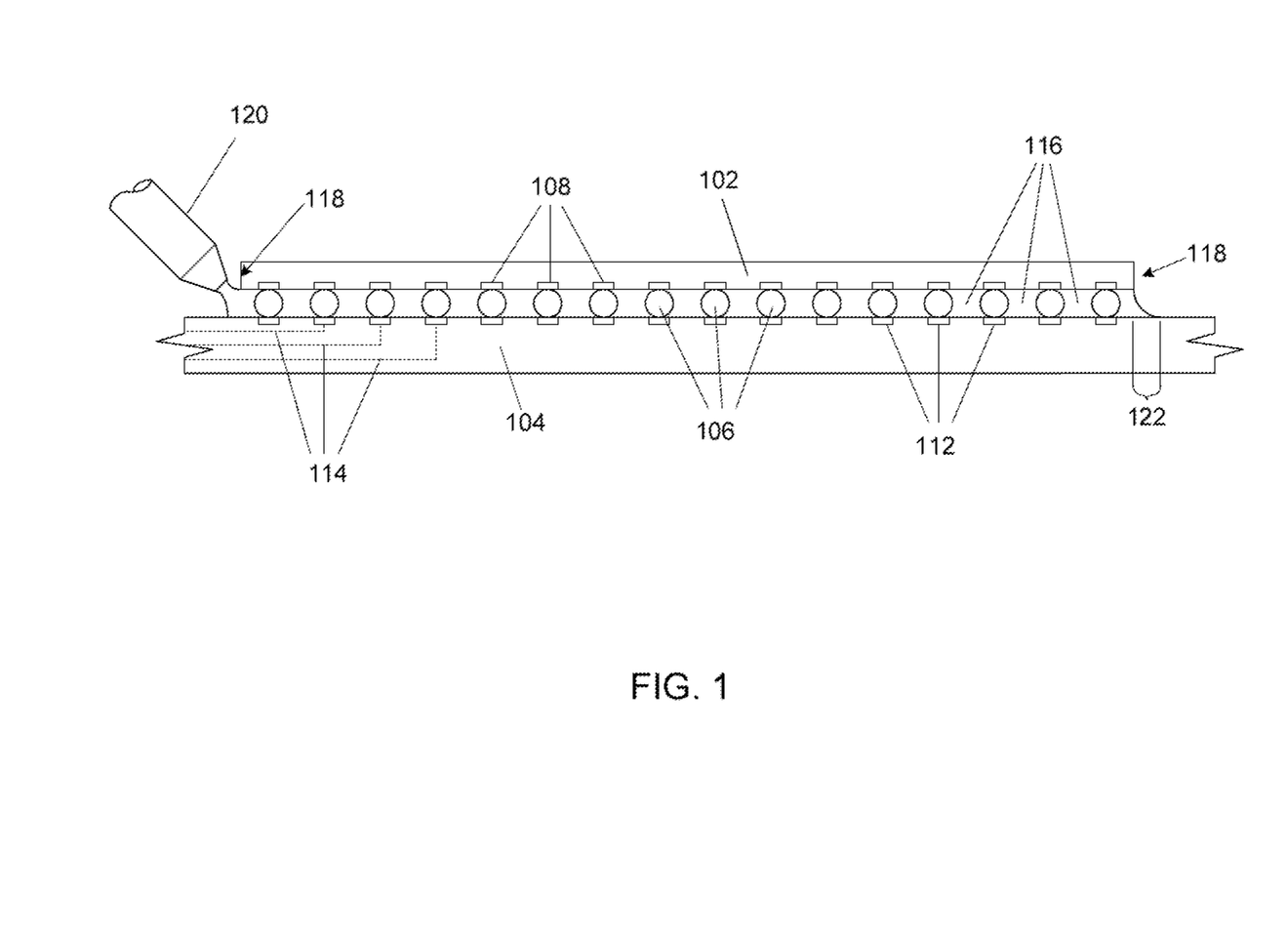
FIG. 1 illustrates a side cross-sectional view of a microelectronic die attached to a substrate with a plurality of interconnects during an underfill process.

In the production of microelectronic devices, microelectronic dice are generally mounted on substrates, which provide electrical communication routes between the microelectronic die and external components. As shown in FIG. 1, a microelectronic die 102, such as a microprocessor, a chipset, a graphics device, a wireless device, a memory device, an application specific integrated circuit, or the like, may be attached to a substrate 104, such as an interposer, a motherboard, and the like, through a plurality of interconnects 106, such as reflowable solder bumps or balls, in a configuration generally known as a flip-chip or controlled collapse chip connection ("C4") configuration. The interconnects 106 may extend between bond pads 108 on the microelectronic die 102 and mirror-image bond pads 112 on the substrate 104. The microelectronic die bond pads 108 are in electrical communication with integrated circuitry (not shown) within the microelectronic die 102. The substrate bond pads 112 are in electrical communication with conductive traces (shown as dashed lines 114) within the substrate 104. The conductive traces 114 provide electrical communication routes to external components (not shown).

The substrate 104 may be primarily composed of any appropriate material, including, but not limited to, bismaleimine triazine resin, fire retardant grade 4 material, polyimide materials, glass reinforced epoxy matrix material, and the like, as well as laminates or multiple layers thereof. The conductive traces 114 may be composed of any conductive material, including but not limited to metals, such as copper and aluminum, and alloys thereof.

The interconnects 106 can be made any appropriate material, including, but not limited to, solders and conductive filled epoxies. Solder materials may include may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the microelectronic die 102 is attached to the substrate 104 with interconnects 106 made of solder, the solder is reflowed, either by heat, pressure, and/or sonic energy to secure the solder between the microelectronic die bond pads 108 and the substrate bond pads 112.

As also shown in FIG. 1, an electrically-insulating underfill material 116 may be deposed between the microelectronic die 102 and the substrate 104, and around the interconnects 106. The underfill material 116 may be used to overcome the mechanical stress issues that can arise from thermal expansion mismatch between the microelectronic die 102 and the substrate 104. The underfill material 116 may be an epoxy material that has sufficiently low viscosity to be wicked between the microelectronic die 102 and the substrate 104 by capillary action when introduced by an underfill material dispenser 120 along an edge 118 of the microelectronic die 102, which will be understood to those skilled in the art. The portion of the underfill material extending past the microelectronic die edge 118 is referred to as an underfill material fillet 122. The underfill material 116 should not be of such a low viscosity that the underfill material fillet 122 extends too far from the microelectronic die edge 118, as it may extend to a "keep-out-zone" (not shown) where the presence of the underfill material 116 would be detrimental. The underfill material 116 may then be subsequently cured (hardened).

Figure 2:
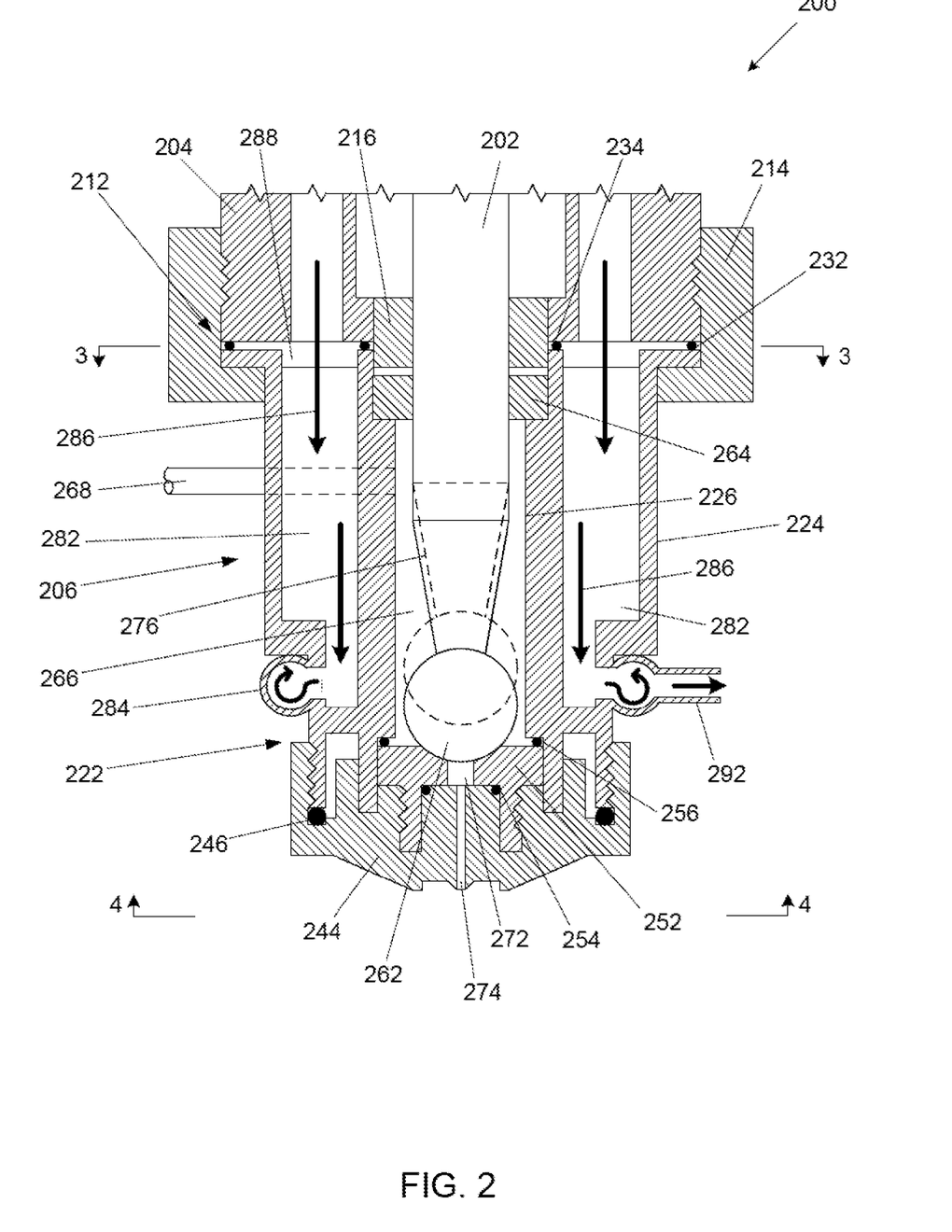
FIG. 2 illustrates a side cross-sectional view of an underfill material dispenser having heater with a plurality of heating ducts extending therethrough.

FIG. 2 illustrates an underfill material dispenser 200 including a needle 202 extending from a valve body 204. The underfill material dispenser 200 further includes a heater 206 substantially surrounding the underfill material dispenser needle 202. A first end 212 of the heater 206 may be attached to the valve body 204 with a clamping collar 214, such as a threaded clamping collar. A valve body bearing 216 may be positioned between the valve body 204 and the underfill material dispenser needle 202 to act as a guide for the underfill material dispenser needle 202.

The heater 206 may include a second end 222 opposing the heater first end 212, as well as an exterior surface 224 and an interior surface 226, wherein the heater interior surface 226 substantially surrounds the underfill material dispenser needle 202 to define an underfill material chamber 266. A body-to-outer heater seal 232 may be disposed between the valve body 204 and the heater first end 212 proximate the heater exterior surface 224. A body-to-inner heater seal 234 may be disposed between the valve body 204 and the heater first end 212 proximate the heater interior surface 226.

A nozzle 244 may be removably attached to the heater second end 222, such as through treaded contact and sealed thereto with a nozzle seal 246. The nozzle 244 may include a needle seat 252 removably attached thereto and sealed with a seat-to-nozzle seal 254. The needle seat 252 may also be sealed to the heater 206 with a seat-to-heater seal 256. The needle seat 252 makes a sealed contact with a tip 262 of the underfill material dispenser needle 202, when in a closed position, as shown. The heater 206 may further include an underfill material chamber seal 264, which surrounds the underfill material dispenser needle 202 and seals against the heater interior surface 226. Thus, the heater interior surface 226, the underfill material chamber seal 264, and the needle seat 252 may further define the underfill material chamber 266. A fluid input conduit 268 may extend from the heater exterior surface 224 to the heater interior surface 226 and allow for the passage of underfill material (not shown) into the underfill material chamber 266.

The needle seat 252 has a conduit 272 extending therethrough, which abuts an exit conduit 274 extending through the nozzle 244. Thus, when the underfill material dispenser needle 202 is in an open position (shown in dashed line 276), underfill material (not shown), which may be disposed in the underfill material chamber 266, may be dispensed through the needle seat conduit 272 and the nozzle exit conduit 274.

Figure 3:
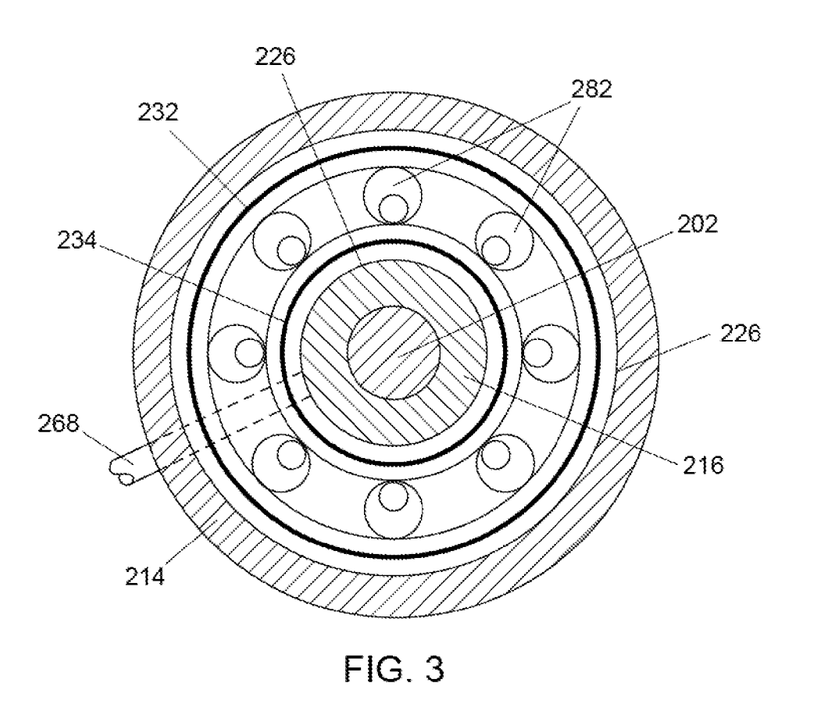
FIG. 3 illustrates a partial top plan view of the assembly of FIG. 2 along line 3-3.

As shown in FIGS. 2 and 3, the heater 206 may further include a plurality of heating ducts 282, substantially extending from the heater first end 212 to the heater second end 222. The heating ducts 282 may empty into a heating fluid evacuation collar 284. The heating ducts 282 are adapted to receive a heating fluid (illustrated as arrows 286), such as through the valve body 204. In one embodiment, the heating fluid 286 may enter a common chamber 288 prior to entering the heating ducts 282. It is understood that heating fluid 286 may be introduced into the common chamber 288 through the heater exterior surface 224, rather than through the valve body 204. The heating fluid 286 may flow through the heating ducts 282 and into the heating fluid evacuation collar 284. The heating fluid 286 then flows out of the heating fluid evacuation collar 284 through a heating fluid evacuation collar exit conduit 292. The heating fluid 286 may be any appropriate liquid, such as water, or any appropriate gas, such as air.

It is, of course, understood that the heating fluid 286 can be regulated between hot and cold fluid inputs (not shown). The temperature of the heater 206 can be monitored with a temperature measuring device (not shown), such as an infra-red temperature sensor, so that the ratio of the cold and hot fluid to be pumped through the system can be regulated at any given time to achieve a desire temperature of the heater 206. The temperature of the heater 206, of course, influences the temperature of the underfill material (not shown) to be dispensed into the underfill material chamber 266 and out the nozzle exit conduit 274.

Figure 4:
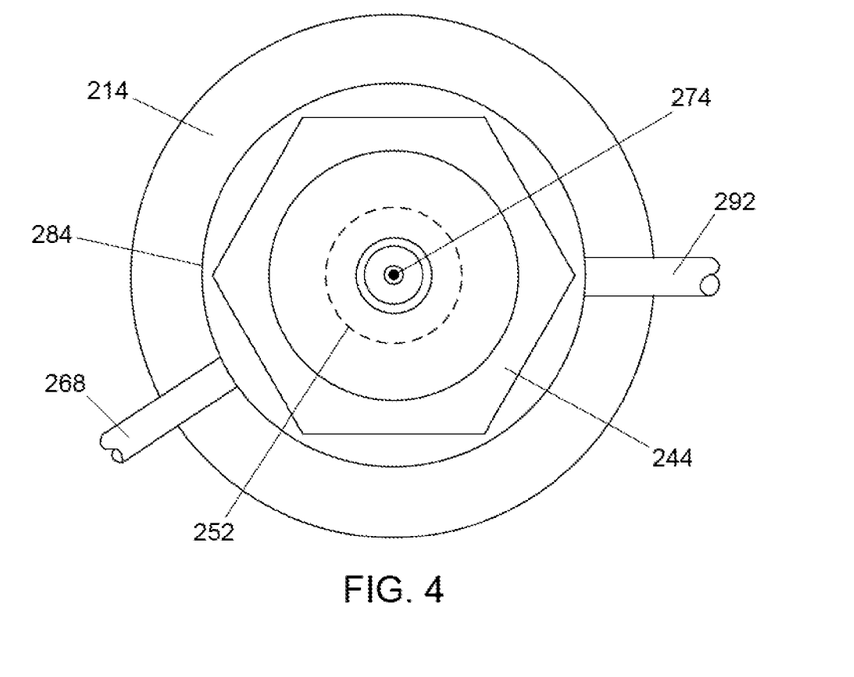
FIG. 4 illustrates a bottom plan view of the assembly of FIG. 2 along line 4-4.

The needle seat 252 is generally a wearable part of the underfill material dispenser 200, because when in operation, the underfill material dispenser needle 202 continuously impacts the needle seat 252. Thus, the needle seat 252 may need periodic replacement. Therefore, in one embodiment, the nozzle 244 may be hexagonal, as shown in FIG. 4, such that is can be removed with a conventional wrench for ease of replacement of the needle seat 252.

All of the components needed to operate the underfill dispense 200 have not been shown, so as not to obscure the subject matter of the present disclosure. It is understood that the entire system might include precision motors to operate to needle between an open and a closed position, pumps, actuators, holding reservoirs, and the like.

Figure 5:
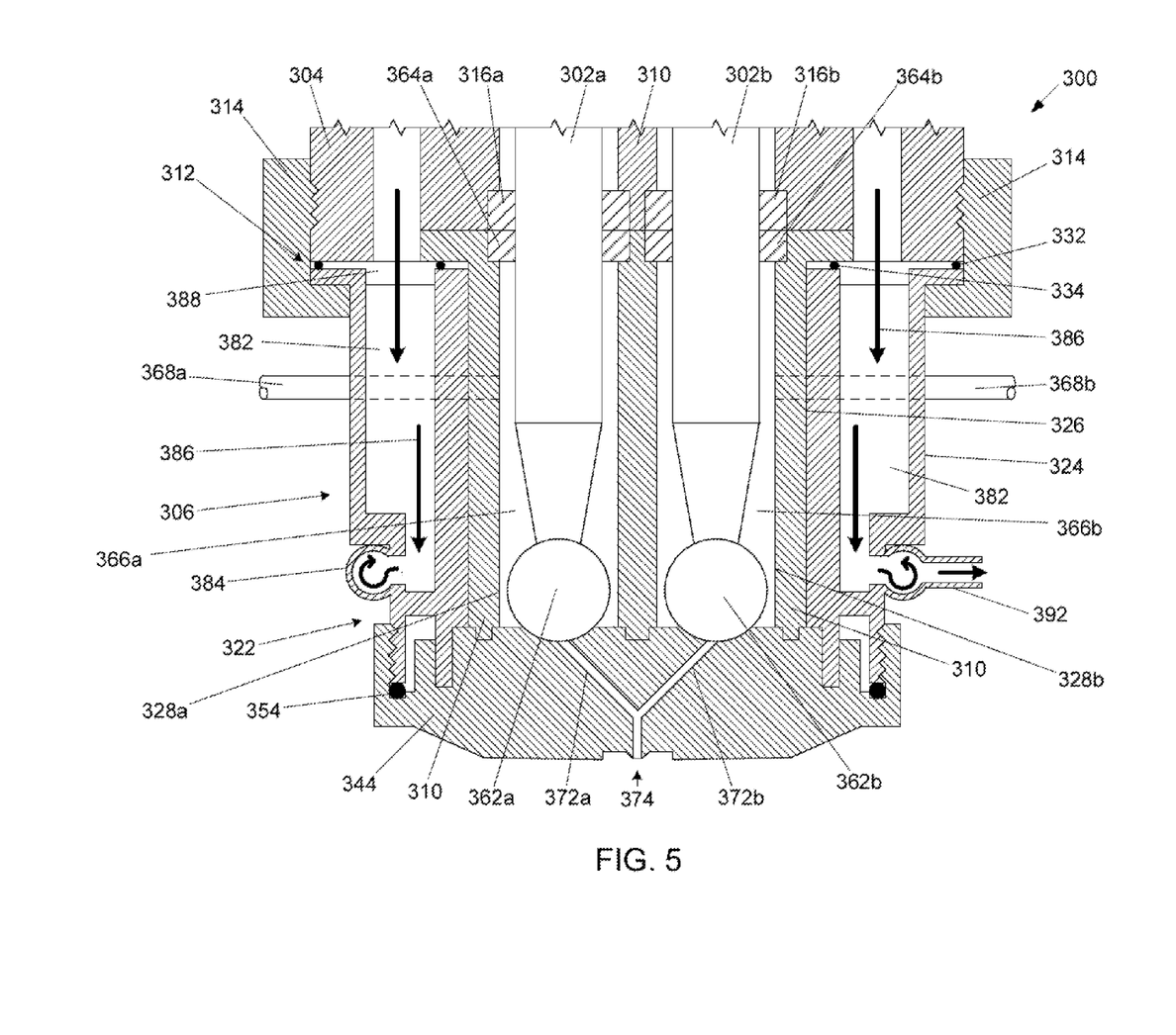
FIGS. 5 and 6 illustrate side cross-sectional views of an underfill material dispenser having heater with a plurality of heating ducts extending therethrough and a plurality of underfill chambers formed therein.

In another embodiment of the present disclosure, an underfill material dispenser may have multiple needles and multiple underfill material chambers with a common nozzle. As shown in FIG. 5, an underfill material dispenser 300 may include a unified underfill chamber housing 310 having at least two underfill material chambers defined therein, shown as a first underfill material chamber 366a and a second underfill material chamber 366b. The first underfill material chamber 366a and the second underfill material chamber 366b each house underfill material dispenser needles, shown as a first underfill material dispenser needle 302a and a second underfill material dispenser needle 302b, respectively, each extending from a valve body 304. The unified underfill chamber housing 310 may include a first underfill material chamber seal 364a and the second underfill material chamber seal 364b, where the first underfill material chamber seal 364a surrounds the first underfill material dispenser needle 302a and seals against a surface 328a of the first underfill material chamber 366a and the second underfill material chamber seal 364b surrounds the second underfill material dispenser needle 302b and seals against a surface 328b of the second underfill material chamber 366b. The underfill material dispenser 300 further includes a heater 306 substantially surrounding and abutting the unified underfill chamber housing 310. Although the first underfill material chamber 366a and the second underfill material chamber 366b are integrated in a single unified underfill chamber housing 310, they are separated from one another, such that they can run independently, as will be discussed.

A first end 312 of the heater 306 may be attached to the valve body 304 with a clamping collar 314, such as a threaded clamping collar. A first valve body bearing 316a may be positioned between the valve body 304 and the first underfill material dispenser needle 302a to act as a guide for the first underfill dispenser needle 302a. A second valve body bearing 316b may be positioned between the valve body 304 and the second underfill material dispenser needle 302b to act as a guide for the second underfill material dispenser needle 302b.

The heater 306 may include a second end 322 opposing the heater first end 312, as well as an exterior surface 324 and an interior surface 326, wherein the heater interior surface 326 substantially surrounds and abuts the unified underfill chamber housing 310. A body-to-outer heater seal 332 may be disposed between the valve body 304 and the heater first end 312 proximate the heater exterior surface 324. A body-to-inner heater seal 334 may be disposed between the valve body 304 and the heater first end 312 proximate the heater interior surface 326.

A nozzle 344 may be attached to the heater second end 322, such as through threadable contact, and sealed thereto with a nozzle seal 354, such that the first underfill chamber 366a and the second underfill chamber 366b share the single nozzle 344. The nozzle 344 makes a sealed contact with a tip 362a of the first underfill material dispenser needle 302a and with a tip 362b of the second underfill material dispenser needle 302b. A first fluid input conduit 368a may extend from the heater exterior surface 324 to the first underfill material chamber seal 364a, which may deliver underfill material (not shown) to the first underfill material chamber 366a. A second fluid input conduit 368b may extend from the heater exterior surface 324 to the second underfill material chamber seal 364b, which may deliver underfill material (not shown) to the second underfill material chamber 366b.

The heater 306 may further include a plurality of heating ducts 382 substantially extending from the heater first end 312 to the heater second end 322. The heating ducts 382 may empty into a heating fluid evacuation collar 384. The heating ducts 382 are adapted to receive a heating fluid (illustrated as arrows 386), such as through the valve body 304. In one embodiment, the heating fluid 386 may enter a common chamber 388 prior to entering the heating ducts 382. It is understood that heating fluid 386 may be introduced into the common chamber 388 through the heater exterior surface 324, rather than through the valve body 304. The heating fluid 386 may flow through the heating ducts 382 and into the heating fluid evacuation collar 384. The heating fluid 386 then flows out of the heating fluid evacuation collar 384 through a heating fluid evacuation collar exit conduit 392. The heating fluid 386 may be any appropriate liquid, such as water, or any appropriate gas, such as air.

It is, of course, understood that the heating fluid 386 can be regulated between hot and cold fluid inputs (not shown). The temperature of the heater 306 can be monitored with a temperature measuring device (not shown), such as an infra-red temperature sensor, so that the ratio of the cold and hot fluid to be pumped through the system can be regulated at any given time to achieve a desire temperature of the heater 306. The temperature of the heater 306, of course, influences the temperature of the underfill material (not shown) to be dispensed into the first underfill material chamber 366a and the second underfill material chamber 366b.

The nozzle 344 may have two separate conduits, first underfill material conduit 372a extending from the first underfill material chamber 366a to a nozzle exit conduit 374 and a second underfill material conduit 372b extending from the second underfill material chamber 366b to the nozzle exit conduit 374, for directing underfill material (not shown) out from the first underfill material chamber 366a and the second underfill material chamber 366b during the operation. In one embodiment, as shown, the first underfill material conduit 372a and the second underfill material conduit 372b converge to a single exit point, i.e. the nozzle exit conduit 374. Although, the first underfill material conduit 372a and the second underfill material conduit 372b may have separate exit conduits, which would allow for a completely independent operation of the first underfill chamber 366a and the second underfill chamber 366b, the landing of the dispensed underfill material would occur at different positions. For example, if the exit points are perpendicular the bottom surface of the nozzle, at any height gap, there will be a distance between the landing locations equal to the distance between the exit points, as will be understood by those skilled in the art. If the two exit points are at converging angles, a similar distance between landing locations will exist, with the difference that this distance will vary with the height gap between the nozzle and the dispense surface. At one height gap only, this distance will be brought to zero, as will also be understood to those skilled in the art.

Figure 6:
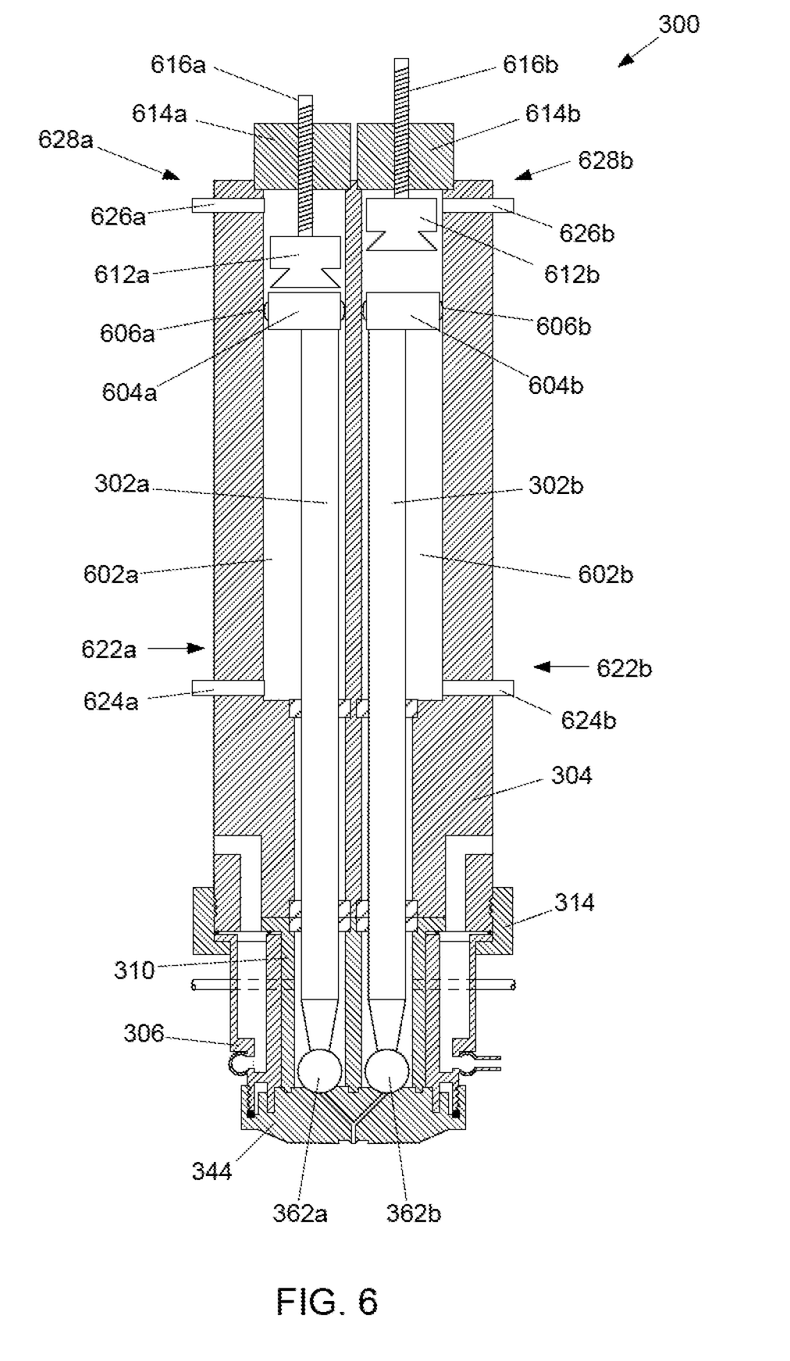

FIG. 6 illustrates one embodiment of the underfill material dispenser 300 directed at the mechanisms that activate the first underfill material dispenser needle 302a and the second underfill material dispenser needle 302b. The valve body 304 may include a plurality of valve body chambers, shown as a first valve body chamber 602a surrounding the first underfill material dispenser needle 302a and a second valve body chamber 602b surrounding the second underfill material dispenser needle 302b. The first underfill material dispenser needle 302a includes a piston 604a attached opposing the first underfill material dispenser needle tip 362a. Likewise, the second underfill material dispenser needle 302b includes a piston 604b attached opposing the second underfill material dispenser needle tip 362b. The first needle piston 604a and the second needle piston 604b include a first seal 606a and a second seal 606b, respectfully, which slidably seals the first needle piston 604a to the first valve body chamber 602a and slidably seals the second needle piston 604b to the second valve body chamber 602b.

The travel distance of the first underfill material dispenser needle 302a and the second underfill material dispenser needle 302b may be determined by a position of a first travel stopper 612a and a second travel stopper 612b, respectively. The position of the first travel stopper 612a and the second travel stopper 612b may be adjusted with a first precision motor 614a and a second precision motor 614b. The first precision motor 614a positions the first travel stopper 612a by moving a first positioning rod 616a that is attached to the first travel stopper 612a. Likewise, the second precision motor 614b positions the second travel stopper 612b by moving a second positioning rod 616b that is attached to the second travel stopper 612b. As will be understood to those skilled in the art, the positions of the first travel stopper 612a and the second travel stopper 612b may be changed during the operation of the underfill material dispenser 300 through computer programmed operation and these changes can be implemented dynamically by the software during the actual dispensation process. This can allow the underfill material dispenser 300 to dynamically dispense underfill material in a specific pattern.

The retraction of the first underfill material dispenser needle 302a may be achieved by allowing compressed fluid, such as air, to enter a lower end 622a of the first valve body chamber 602a through a lower conduit 624a, while allowing fluid to exit an upper conduit 626a of the first valve body chamber 602a proximate the upper end 628a thereof. This will push the first needle piston 604a toward the first valve body chamber upper end 628a, thereby retracting the first underfill material dispenser needle tip 362a away from the nozzle 344, until the first needle piston 604a contacts the first travel stopper 612a. The extension of the first underfill material dispenser needle 302a may be achieved by allowing compressed fluid, such as air, to enter the first valve body chamber upper end 628a through the first valve body chamber upper conduit 626a, while allowing fluid to exit the first valve body chamber lower conduit 624a. This will push the first needle piston 604a toward the first valve body chamber lower end 622a, thereby extending the first underfill material dispenser needle tip 362a toward the nozzle 344, until the first underfill material dispenser needle tip 362a contacts the nozzle 344. Of course, the second valve body chamber 602b may operate in the same manner wherein the second valve body chamber 602b includes a second valve body chamber lower end 622b, a second valve body chamber upper end 628b, a second valve body chamber lower conduit 624b, and a second valve body chamber upper conduit 626b. The first valve body chamber 602a and the second valve body chamber 602b are separated from one another, such that the movement of first underfill material dispenser needle 302a and the second underfill material dispenser needle 302b are independent of the movement of the other.

It is understood that the described extension and retraction of the needles may be controlled independently and operate in only one valve body chamber, or in both valve body chambers, either in unison or in tandem. If the valve body chambers are operated in tandem, pressurization of the first valve body chamber upper end 628a would correspond to the pressurization of the second valve body chamber lower end 622b, and vice versa, in rotation, with the pressurization time being of the same value.

The current embodiment may be utilized such that a single valve body chamber may be used to dispense underfill material for a part of the pattern and both valve body chambers for another part of it. By moving from one valve body chamber operation to a two valve body chamber operation the run rate is changed without a change of hardware and a new setup. Furthermore, operating a single chamber in one part of the pattern and both in a different part will achieve dispensing different shot weights in a single pattern, without interrupting the flow of the process. The modification of the dispense volume during operation will bring added flexibility to this dynamic dispense.

In the current embodiment, the presence of two or more underfill material chambers can be operated independently of one another, which allows for a tandem operation, as previously discussed, in which while one chamber loads, the other one can dispense. With a two underfill material chamber design, the dispense time can be cut in half, because the idle time for one underfill material chamber filling with underfill material for the next dispense drop, can be used by the other underfill material chamber to dispense. Thus, the frequency of dispensing is doubled.

With the current embodiment, since each underfill material chamber can be operated independently, two underfill materials could be loaded up in the same dispense. This can be beneficial for situations where two underfill materials need to be dispensed on the same units. The whole operation may take part in a single tool, with a single setup, which can result in tool space reduction and improved productivity.

In the current embodiment, the use of precision motors operating independently on each underfill material dispense needle allows for change of the volume dispensed by each underfill material chamber while the underfill material dispenser is in process, by varying the travel of each underfill material dispense needle during a dispense run.

Figure 7:
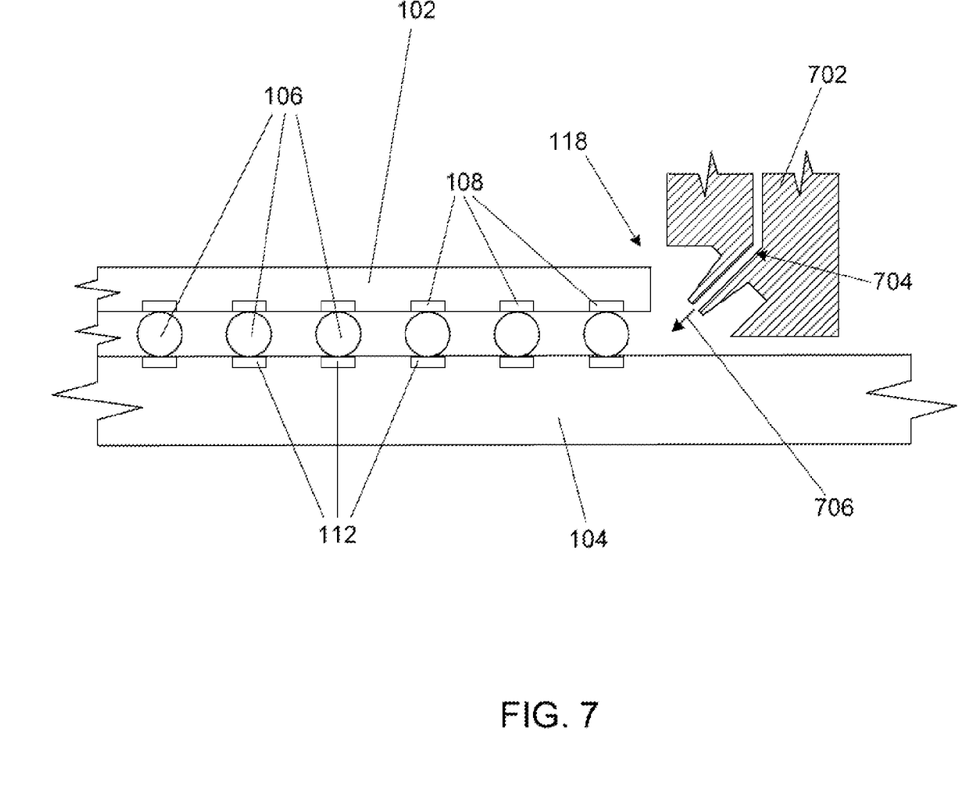
FIG. 7 illustrates a side cross-sectional view of an underfill material dispenser having a nozzle having an angled nozzle exit conduit.

In another embodiment, the nozzle may be designed with an angled nozzle exit conduit. As shown in FIG. 7, an angular dispense nozzle 702 having an angled nozzle exit conduit 704 may be utilized to be able to dispense underfill material 116 close to the microelectronic die edge 118 and in a direction 706 substantially between the microelectronic die 102 and the substrate 104 The utilization of the angular dispense nozzle 702 may improve the integrity of the underfill material fillet 122 (see FIG. 1) integrity, may increase dispense stability, and may reduce that likelihood that the underfill material fillet 122 (see FIG. 1) will encroach on the keep-out-zone (not shown). It is understood that the angled nozzle 702 may be integrated as the nozzle 244 of FIG. 2 or the nozzle 344 of FIGS. 5 and 6.

Figure 8:
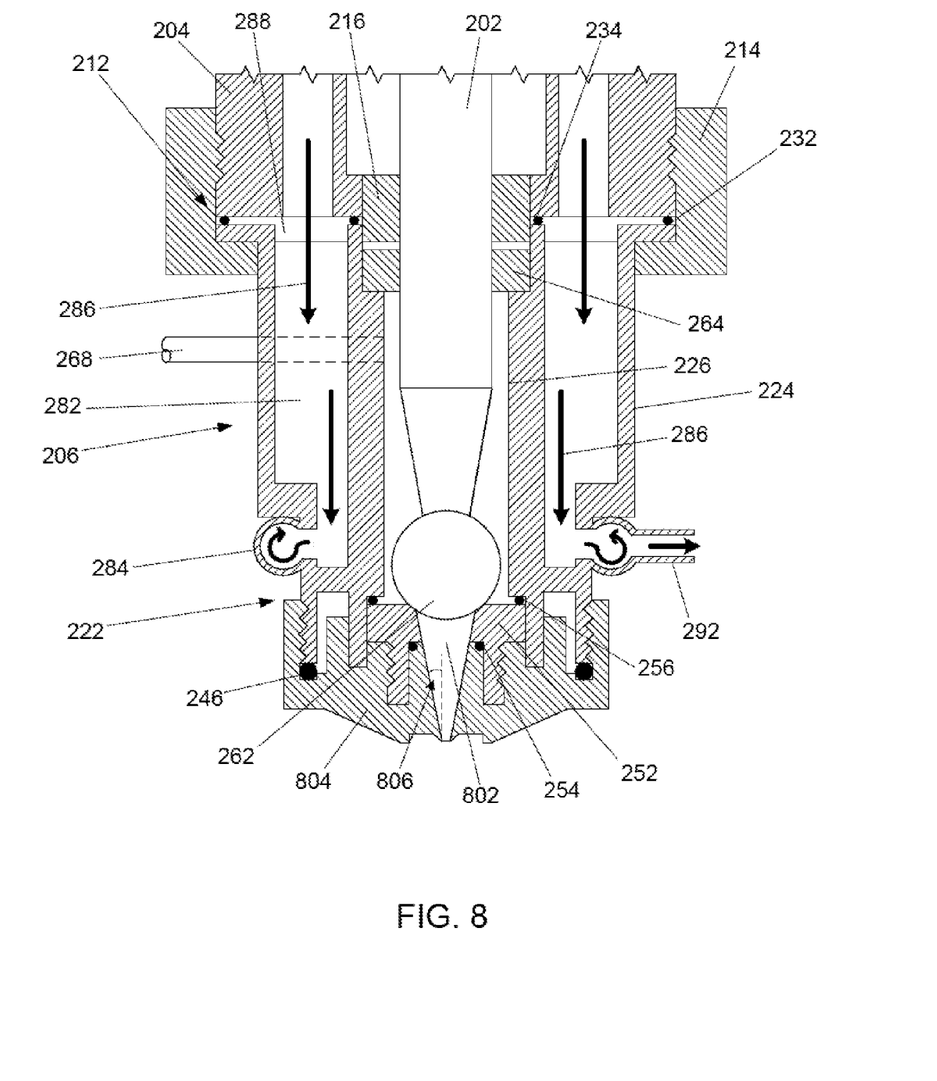
FIG. 8 illustrates a side cross-sectional view of an underfill material dispenser having a nozzle with a conical nozzle exit conduit.

In another embodiment as shown in FIG. 8, the nozzle may be designed with a conical nozzle exit conduit. Underfill material can be dispensed as a plurality of substantially spherical droplets or "dots" (usually used with Newtonian fluids) or in a stream (usually used with non-Newtonian fluids). In dispensation with a plurality of dots, it is optimal if each dot achieves a perfect break of each dot from the nozzle, and, in the dispensation of a stream of underfill material, it is optimal if the stream achieves a perfect break from the nozzle at the end of the dispensation. However, breaks are generally not perfect and a tail is formed on the dot or stream. This tail can form small droplets called satellites. If satellites proliferate from a dispense zone to different areas of the microelectronic die, to the package, and/or to the process carriers, it can lead to underfill excursions and rejection of significant quantities of products, as will be understood to those skilled in the art. The satellite problem becomes exacerbated for small nozzle geometries, and can prevent process developments in underfill material dispensation processes for small die-to-die and keep-out-zone spacing of less than about 2 mm.

Shear forces can be a factor in the generation of satellites. They can be generated while the underfill material is being dispensed and when the needle is drawn back during opening (especially with insufficient fluid pressure). Furthermore, a recirculation or "dead-zone" may be created at the shape edges in non-conical conduits (such as between the underfill material chamber(s) and the exit conduit(s)), this recirculation can result in underfill material being entrained within the dead-zone and can result in non-fresh underfill material being dispensed, which can have an impact on the flow characteristics of the underfill material when dispensed.

As shown in FIG. 8, a substantially conical-shaped exit conduit 802 can be formed in a nozzle 804. The angle 806 of the conical-shaped exit conduit 802 can be between 15 and 60 degrees depending on the underfill material used. It has been found that angling the conduit into a cone shaped aperture can significantly reduce shear force generation which reduces satellite formation. Furthermore, it has been found that a cone shaped aperture may result in little or no recirculation or "dead-zone" during dispensing due to its streamlined design compared to a non-conical nozzle exit conduits, which have sharp corner created by "seat" and "nozzle" combination. Thus, the conical-shaped exit conduit 802 can consistently dispense fresh underfill material, even with low fluid pressure.

Figure 9:
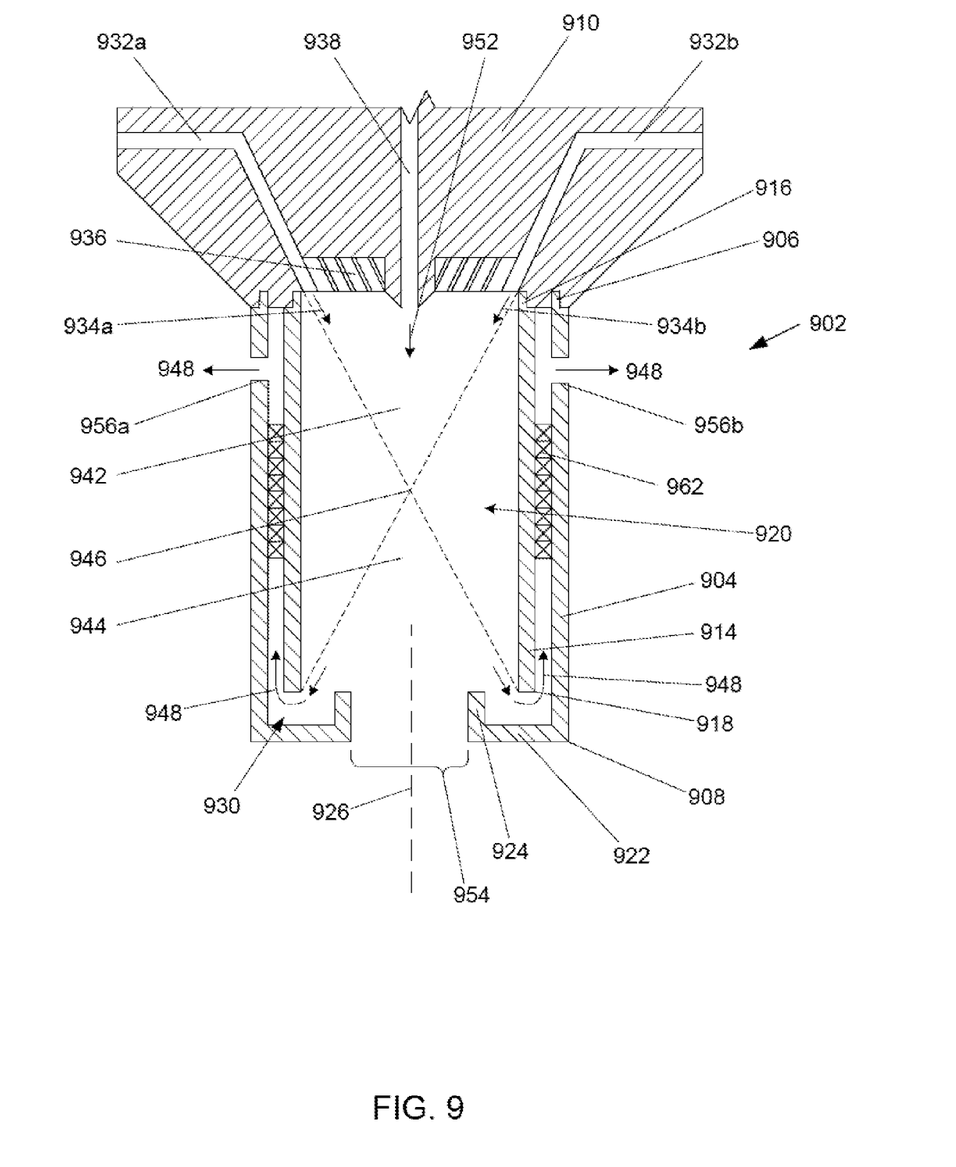
FIG. 9 illustrates a side cross-sectional view of an underfill material dispenser having a satellite trap attached to a nozzle.

In another embodiment of the present description, a nozzle may include a satellite trap. FIG. 9 illustrates a satellite trap 902 according to one embodiment of the present disclosure, wherein the satellite trap 902 may include a substantially cylindrical outer wall 904 attached by a first end 906 to a nozzle 910 and having a second end 908 substantially opposing the satellite trap outer wall first end 906. The satellite trap 902 may further include a substantially cylindrical inner wall 914 positioned substantially concentrically within the satellite trap outer wall 904 around a centerline 926 of the satellite trap 902 and attached by a first end 916 to the nozzle 910, wherein the satellite trap inner wall 914 further includes a second end 918 substantially opposing the satellite trap inner wall first end 916. The cylindrical inner wall 914 defines a passage 920 therein.

The satellite trap outer wall 904 further includes a flange 922 extending substantially perpendicularly from the satellite trap outer wall second end 908 for the satellite trap outer wall 904 toward the satellite trap centerline 926. The flange 922 may include a lip 924 extending substantially perpendicularly toward the nozzle 910 from a portion of the flange 922 nearest the satellite trap centerline 926. The combination of the satellite trap outer wall 904, the flange 922, and the flange lip 924 may form a trap channel 930.

The nozzle 910 may include at least one air inlet conduit, shown as a first air inlet conduit 932a and a second air intel conduit 932b, which may direct air stream(s) into the passage 920 and into a direction controlling air ring 936 proximate and surrounding an exit conduit 938 of the nozzle 910. In one embodiment, the first air inlet conduit 932a and the opposing second air inlet conduit 932b are configured to direct an air stream 934a and 934b, respectively, at an angle into the direction controlling air ring 936. From the incoming air stream, the direction controlling air ring 936 generates two symmetrical air vortexes or cones, a first air cone 942 and a mirror-image second air cone 944, which converge at an intersection point 946 within the passage 920. The first air cone 942 and the second air cone 944 may be referred to collectively as an air curtain. In one embodiment, the angle under which the air is directed from the first air inlet conduit 932a, the second air inlet conduit 932b, and the direction controlling air ring 936 is calculated such that the air curtain will direct any small particles toward the satellite trap inner wall second end 918 and into the trap channel 930 carried by an exit air stream 948 of the second air cone 944.

The passage 920 within the satellite trap inner wall 914 allows each dot of underfill material (shown by arrow 952) to dispense freely, without being impeded by external forces. In order to exit the satellite trap 902, the underfill material dot 952 will have to traverse the intersection point 946. However, this may affect the underfill material dot 952 by possibly diverting it from its original trajectory, or, depending on the pressure, by possibly dispersing it. Thus, the first air conduit air stream 934a and the second air conduit air stream 934b will need to be pulsed and timed to be set out-of-phase with the underfill material dot 952 ejection from the nozzle exit conduit 938, and activated after the underfill material dot 952 has passed the intersection point 946 and is about to exit the satellite trap 902. The intersection point 946 may have a scissoring effect on a tail of the underfill material dot 952 in the formation of a satellite, and the satellite is transported to and collected in the trap channel 930 by the second air cone exit air stream 948. As the first air cone 942 and the second air cone 944 need to be present in the satellite trap 902 only in the last part of an underfill material dot 952 dispense, i.e. at the breaking of the tail forming the satellite, the air input may be controlled by a programmable solenoid, wherein the duration and repeatability of the pulse may be determined by a calibration of dispense geometry for different underfill materials, temperatures, and strokes of the needles, as will be understood to those skilled in the art.

An opening 954 defined by the flange lip 924 may be sized to allow sufficient clearance for the underfill material dot 952 (independent of speed and shape) to exit the satellite trap 902 unimpeded. The satellite trap outer wall 904 may have at least one exhaust port therethrough, shown as first exhaust port 956a and a second exhaust port 956b, proximate the nozzle 910. The second air cone exit air stream 948 may pass between the satellite trap outer wall 904 and satellite trap inner wall 914 to exit the first exhaust port 956a and the second exhaust port 956b. To ensure that accumulated underfill satellites in the trap channel 930 will not be carried by the second air cone exit air stream 948 out through the exhaust port(s), e.g. first exhaust port 956a and second exhaust port 956b, a filter 962 may be disposed between the satellite trap outer wall 904 and the satellite trap inner wall 914. In one embodiment, the filter 962 may be a ring of metal mesh cloth, such as a fine stainless steel mesh cloth, that may be attached to the satellite trap inner wall 914 before the final assembly of the satellite trap 902 is completed. The large surface area of the metal mesh cloth will ensure that the accumulated underfill satellites will be substantially blocked.

The satellite trap 902 of the present description may provide a solution for satellite control of small aperture nozzles, which may be critical in small die-to-die and keep-out-zone specifications and may reduce the need to dispense underfill material very close to the substrate. The reduction of satellites may, of course, increase yield by reducing cosmetic defect rejection from satellites, and may improve of underfill material dot-weight stability for small form factor hardware combinations, as will be understood to those skilled in the art.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. An underfill material dispenser, comprising:
    a heater having a first end and an opposing second end, the heater further having an exterior surface and an interior surface;
    a plurality of heating ducts defined within the heater between the heater exterior surface and the heater interior surface, and extending from the heater first end to the heat second end;
    an underfill material chamber defined within the heater;
    a needle disposed within the underfill material chamber;
    a nozzle attached to the heater second end, wherein the nozzle includes an exit conduit; and
    a satellite trap attached to the nozzle, wherein the satellite trap comprises:
        a substantially cylindrical outer wall attached by a first end to the nozzle and having a second end opposing the satellite trap outer wall first end;
        a substantially cylindrical inner wall positioned substantially concentrically within the satellite trap outer wall and attached by a first end to the nozzle, wherein the satellite trap inner wall further includes a second end substantially opposing the satellite trap inner wall first end;
        a flange extending substantially perpendicularly from the satellite trap outer wall second end toward a centerline of the satellite trap;
        a flange lip extending substantially perpendicularly toward the nozzle from a portion of the flange nearest the satellite trap centerline, wherein the satellite trap outer wall, the flange, and the flange lip form a trap channel; and
        at least one air inlet conduit extending through the nozzle and angled to form two symmetrical air cones, within a passage defined by the satellite trap inner wall, upon introduction of air through the at least one air conduit.

2. The underfill material dispenser of claim 1, wherein the heater further comprises an evacuation collar proximate the heater second end, which is adapted to receive a fluid from the plurality of heating ducts.

3. The underfill material dispenser of claim 1, wherein the satellite trap further comprises a direction controlling air ring proximate and surrounding the nozzle exit conduit.

4. The underfill material dispenser of claim 1, further including at least one exhaust port extending through the satellite trap outer wall proximate the nozzle.

5. The underfill material dispenser of claim 1, further including a filter disposed between the satellite trap outer wall and the satellite trap inner wall.

6. The underfill material dispenser of claim 5, wherein the filter comprises metal mesh cloth.

7. A material dispenser, comprising:
    a satellite trap attached to a nozzle, wherein the satellite trap comprises:
        a substantially cylindrical outer wall attached by a first end to the nozzle and having a second end opposing the satellite trap outer wall first end;
        a substantially cylindrical inner wall positioned substantially concentrically within the satellite trap outer wall and attached by a first end to the nozzle, wherein the satellite trap inner wall further includes a second end substantially opposing the satellite trap inner wall first end;
        a flange extending substantially perpendicularly from the satellite trap outer wall second end toward a centerline of the satellite trap;
        a flange lip extending substantially perpendicularly toward the nozzle from a portion of the flange nearest the satellite trap centerline, wherein the satellite trap outer wall, the flange, and the flange lip form a trap channel; and
        at least one air inlet conduit extending through the nozzle and angled to form two symmetrical air cones, within a passage defined by the satellite trap inner wall, upon introduction of air through the at least one air conduit.

8. The material dispenser of claim 7, wherein the heater further comprises an evacuation collar proximate the heater second end, which is adapted to receive a fluid from the plurality of heating ducts.

9. The material dispenser of claim 7, wherein the satellite trap further comprises a direction controlling air ring proximate and surrounding the nozzle exit conduit.

10. The material dispenser of claim 7, further including at least one exhaust port extending through the satellite trap outer wall proximate the nozzle.

11. The material dispenser of claim 7, further including a filter disposed between the satellite trap outer wall and the satellite trap inner wall.

12. The material dispenser of claim 11, wherein the filter comprises metal mesh cloth.

* * * * *